United States Patent [19]
Telford et al.

[11] Patent Number: 5,482,749
[45] Date of Patent: Jan. 9, 1996

[54] PRETREATMENT PROCESS FOR TREATING ALUMINUM-BEARING SURFACES OF DEPOSITION CHAMBER PRIOR TO DEPOSITION OF TUNGSTEN SILICIDE COATING ON SUBSTRATE THEREIN

[75] Inventors: Susan Telford, Cupertino, Calif.; Michio Aruga, Inba, Japan; Mei Chang, Cupertino, Calif.

[73] Assignee: Applied Materials, Inc., Santa Clara, Calif.

[21] Appl. No.: 364,022

[22] Filed: Dec. 23, 1994

Related U.S. Application Data

[63] Continuation of Ser. No. 138,179, Oct. 14, 1993, abandoned, which is a continuation-in-part of Ser. No. 83,420, Jun. 28, 1993, abandoned.

[51] Int. Cl.$^6$ .................. B05D 3/06; B05D 7/22; C23C 16/42
[52] U.S. Cl. .................. 427/578; 427/237; 427/238; 427/239; 427/255.2; 427/255.1; 427/255.7; 427/307; 427/126.1
[58] Field of Search .................. 427/578, 230, 427/237, 238, 239, 255.2, 255.1, 255.7, 307, 126.1

[56] References Cited

U.S. PATENT DOCUMENTS

| | | | |
|---|---|---|---|
| 4,684,542 | 8/1987 | Jasinski et al. | 437/245 |
| 4,692,343 | 9/1987 | Price et al. | 427/38 |
| 4,785,962 | 11/1988 | Toshima | 220/260 |
| 4,851,295 | 7/1989 | Brors | 428/450 |
| 4,897,171 | 1/1990 | Ohmi | 204/298 |
| 4,966,869 | 10/1990 | Hillman et al. | 437/200 |
| 5,096,534 | 3/1992 | Ozias | 156/611 |
| 5,119,541 | 6/1992 | Ohmi et al. | 29/25.02 |
| 5,175,017 | 12/1992 | Kobayashi et al. | 427/8 |
| 5,180,432 | 1/1993 | Hansen | 118/697 |
| 5,203,956 | 4/1993 | Hansen | 156/643 |
| 5,207,836 | 5/1993 | Chang | 134/1 |
| 5,231,056 | 7/1993 | Sandhu | 437/200 |
| 5,273,588 | 12/1993 | Foster et al. | 118/723 E |

FOREIGN PATENT DOCUMENTS

| | | | |
|---|---|---|---|
| 0134645 | 6/1984 | European Pat. Off. | C23C 14/14 |
| 0428733 | 4/1990 | European Pat. Off. | H01L 21/285 |
| 63-293920 | 11/1988 | Japan | H01L 21/302 |
| 63-310956 | 12/1988 | Japan | C23C 14/04 |
| 1-064324 | 3/1989 | Japan | H01L 21/302 |
| 3-194948 | 8/1991 | Japan | H01L 21/68 |
| WO91/17839 | 11/1991 | WIPO | B05C 13/00 |

OTHER PUBLICATIONS

Gregory, Richard B., et al., "RBS and SIMS Characterization of Tungsten Silicide Deposited by Using Dichlorosilane and Tungsten Hexafluoride", *Surface and Interface Analysis*, vol. 14, 1989, pp. 13–17.

*Primary Examiner*—Roy V. King
*Attorney, Agent, or Firm*—John P. Taylor; Charles G. Guenzer

[57] ABSTRACT

A process is disclosed for pretreating aluminum-bearing surfaces in a vacuum deposition chamber after a previous step of cleaning the chamber, and prior to depositing tungsten silicide on substrates in the chamber, which first comprises treating the aluminum-bearing surfaces with a mixture of silane and a tungsten-bearing gas, such as $WF_6$, to form a first deposition of a silane-based tungsten silicide on the aluminum-bearing surfaces. In a preferred embodiment, the process further comprises subsequently treating the already coated aluminum-bearing surfaces of the chamber in a second step with a mixture of a tungsten-bearing gas, such as $WF_6$, and a chlorine-substituted silane such as dichlorosilane ($SiH_2Cl_2$), monochlorosilane ($SiH_3Cl$), or trichlorosilane ($SiHCl_3$) to form a chlorine-substituted silane-based tungsten silicide deposition over the previous deposited silane-based tungsten silicide.

25 Claims, 1 Drawing Sheet

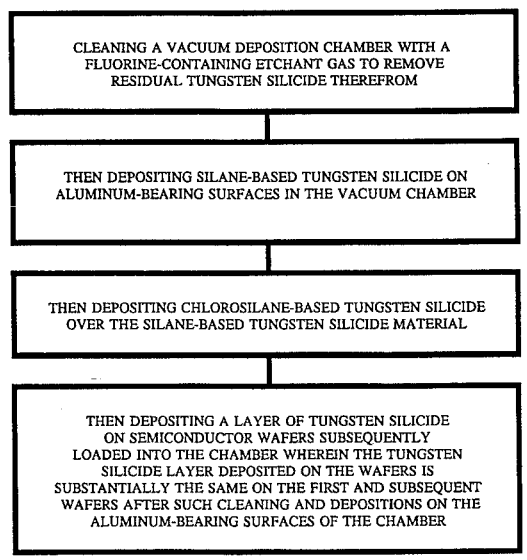

CLEANING A VACUUM DEPOSITION CHAMBER WITH A
FLUORINE-CONTAINING ETCHANT GAS TO REMOVE
RESIDUAL TUNGSTEN SILICIDE THEREFROM

THEN DEPOSITING SILANE-BASED TUNGSTEN SILICIDE ON
ALUMINUM-BEARING SURFACES IN THE VACUUM CHAMBER

THEN DEPOSITING CHLOROSILANE-BASED TUNGSTEN SILICIDE
OVER THE SILANE-BASED TUNGSTEN SILICIDE MATERIAL

THEN DEPOSITING A LAYER OF TUNGSTEN SILICIDE
ON SEMICONDUCTOR WAFERS SUBSEQUENTLY
LOADED INTO THE CHAMBER WHEREIN THE TUNGSTEN
SILICIDE LAYER DEPOSITED ON THE WAFERS IS
SUBSTANTIALLY THE SAME ON THE FIRST AND SUBSEQUENT
WAFERS AFTER SUCH CLEANING AND DEPOSITIONS ON THE
ALUMINUM-BEARING SURFACES OF THE CHAMBER

PRETREATMENT PROCESS FOR TREATING ALUMINUM-BEARING SURFACES OF DEPOSITION CHAMBER PRIOR TO DEPOSITION OF TUNGSTEN SILICIDE COATING ON SUBSTRATE THEREIN

CROSS-REFERENCE TO RELATED APPLICATIONS

This application is a continuation of Telford et al. Ser. No. 08/138,179, filed Oct. 14, 1993 as a continuation-in-part of Telford et al. Ser. No. 08/083,420 filed Jun. 28, 1993, and assigned to the assignee of this application, both of them are now abandoned.

BACKGROUND OF THE INVENTION

1. Field of the Invention

This invention relates to a pretreatment process for a deposition chamber. More particularly, this invention relates to a pretreatment process for treating the surfaces of a deposition chamber, after a cleaning step and prior to deposition of a materials such as tungsten silicide on a substrate.

2. Description of the Related Art

In the deposition of a material such as a tungsten silicide on a substrate, residues from the deposition process, e.g., tungsten silicide residues, may also be deposited on the surfaces of the deposition chamber, including the chamber walls and the susceptor used to support the substrate in the deposition chamber. Repeated tungsten silicide depositions results in the buildup of such undesirable residues on the deposition chamber surfaces. To prevent such residues from flaking off the chamber surfaces, which would result in contamination of the substrate being processed in the chamber, the chamber is subject to periodic cleaning to remove such deposition residues. The removal of such tungsten silicide residues from the deposition chamber surface may be accomplished by the use of a fluorine-containing etchant such as $NF_3$ or $C_2F_6$ gas.

Normally, the cleaning of the chamber is performed using a plasma in conjunction with such fluorine-containing etchant gases and may be followed by a passivation treatment with hydrogen to remove fluorine-bearing residues remaining in the chamber. However, in the subsequent deposition of tungsten silicide, after such a cleaning treatment, it has been found that the initial substrate subsequently mounted on the susceptor is not adequately receptive to the deposition of a layer of tungsten silicide.

Thus, the tungsten silicide, deposited on the initial or first substrate processed after cleaning, is of inferior quality and must be rejected. This, of course, is not only a rejection or loss of the cost of the tungsten silicide layer but also is a rejection or loss of any other structure previously formed on the substrate, e.g., an integrated circuit structure created to that point on a semiconductor wafer. It will be seen that the loss is not insubstantial. If the vacuum chamber is cleaned, for example, after every tenth wafer treated with tungsten silicide, the number of wafers rejected can amount to ten percent.

This problem is most apparent when a combination of a tungsten-bearing gas such as $WF_6$ is used in connection with a chlorine-substituted silane gas such as dichlorosilane (DCS). Since the formation of a tungsten silicide layer using a chlorine-substituted silane gas has been found to provide step coverage over an uneven substrate surface superior to the use of silane itself, it is important that a way be found to periodically clean the deposition chamber to remove undesired deposition residues without, however, interfering with subsequent depositions of tungsten silicide on substrates, and in particular, without incurring the inferior deposition of tungsten silicide on the first or initial substrate processed after such a cleaning of the vacuum chamber.

In a prior application, Telford et al. Ser. No. 07/968,710, filed Oct. 30, 1992, and assigned to the assignee of this case, it was proposed to use an aluminum nitride-coated graphite susceptor for a substrate, when forming tungsten silicide thereon, because of the higher deposition temperatures normally associated with the formation of tungsten silicide materials. While the graphite susceptor was more resistant to warpage, etc, than conventional aluminum susceptors, the use of an aluminum nitride coating over the graphite surfaces was found to be necessary to provide sufficient corrosion resistance to the graphite susceptor.

While such an aluminum nitride-coated graphite susceptor was found to be useful in the formation of tungsten silicide at elevated temperatures, e.g., temperatures in excess of about 400° C., the above problems concerning the deposition of tungsten silicide on a first substrate after a cleaning step were first discovered during the use of such a coated susceptor in connection with the formation of tungsten silicide on a substrate on the susceptor using a tungsten fluoride/dichlorosilane gas combination. Therefore, in our parent application Telford et al. Ser. No. 08/083,420, the disclosure of which is hereby incorporated by reference, we addressed this problem by proposing a pretreatment or conditioning to be carried out on the susceptor in the deposition chamber after each cleaning operation, and prior to the processing of the first substrate after such a cleaning step.

In particular, we taught a preconditioning treatment in which, after the cleaning of the deposition chamber, a deposition of tungsten silicide was carried out in the chamber, without a substrate on the susceptor, and using a combination of a tungsten-bearing gas such as $WF_6$; a chlorine-substituted silane gaseous silicon source such as, for example, dichlorosilane ($SiH_2Cl_2$), monochlorosilane ($SiH_3Cl$), or trichlorosilane ($SiHCl_3$); and a carrier gas, such as argon or helium.

While this precoating or preconditioning procedure, as described and claimed in our parent application, resulted in the subsequent formation of a satisfactory coating of tungsten silicide on even the first substrate processed in the chamber after a cleaning step, it was found that in some instances, particularly when a chlorosilane was used in the preconditioning treatment, subsequent deposits on substrates, e.g., after the processing of 10 or more substrates, resulted in the eventual build up of residues on the chamber surfaces, including the susceptor surfaces which tended to more readily flake off and form particles than previously deposited residues on the chamber surfaces.

While we do not wish to be bound by any theories, it appears that when a chlorosilane-based tungsten silicide deposit was made, to precondition the susceptor and any other aluminum-bearing chamber surfaces deposited upon in situ, the resultant deposit did not form a good bond to the underlying aluminum-bearing surfaces, apparently due to the stressed nature of the chlorosilane-based tungsten silicide material deposited thereon.

Thus, the solution to the problem of an inferior formation of tungsten silicide on the first substrate processed after a cleaning step, in turn, seemingly created a separate problem which needs to be solved.

SUMMARY OF THE INVENTION

Our invention is, therefore directed to a process for addressing the problem of the formation of an inferior tungsten silicide coating, on the first substrate processed in a chamber after the chamber has been cleaned, in a manner which will also inhibit the subsequent formation of particles in the chamber due to flaking off of residues deposited on the chamber surfaces.

In accordance with the invention, aluminum-bearing surfaces in a deposition chamber are treated, after a previous step of cleaning the chamber, and prior to depositing tungsten silicide on substrates in the chamber, in a process which first comprises treating the aluminum-bearing surfaces with a mixture of silane and a tungsten-bearing gas, such as $WF_6$, to form a first deposition of a silane-based tungsten silicide. In a preferred embodiment, the process further comprises subsequently treating the already coated aluminum-bearing surfaces of the chamber in a second step with a mixture of a tungsten-bearing gas, such as $WF_6$, and a chlorine-substituted silane such as dichlorosilane ($SiH_2Cl_2$), monochlorosilane ($SiH_3Cl$), or trichlorosilane ($SiHCl_3$) to form a chlorine-substituted silane-based tungsten silicide deposition over the previous deposited silane-based tungsten silicide.

BRIEF DESCRIPTION OF THE DRAWINGS

The sole drawing is a flowsheet of the preferred embodiment of the process of the invention.

DETAILED DESCRIPTION OF THE INVENTION

The invention solves the problem of the formation of an inferior tungsten silicide coating, on the first substrate processed in a chamber after the deposition chamber has been cleaned, by a pretreatment process which also inhibits the subsequent formation of particles in the chamber due to flaking off of residues deposited on the chamber surfaces during the processing of substrates therein.

In accordance with the invention, aluminum-bearing surfaces in a deposition chamber are treated, after a previous step of cleaning the chamber, in a process which first comprises: treating the aluminum-bearing surfaces with a mixture of silane and a tungsten-bearing gas, such as $WF_6$, to form a first deposition of a silane-based tungsten silicide. In a preferred embodiment, the pretreatment process further comprises subsequently treating the already coated aluminum-bearing surfaces of the chamber in a second step with a mixture of a tungsten-bearing gas, such as $WF_6$, and a chlorine-substituted silane such as dichlorosilane ($SiH_2Cl_2$), monochlorosilane ($SiH_3Cl$), or trichlorosilane ($SiHCl_3$) to form a chlorine-substituted silane-based tungsten silicide deposition over the previous deposited tungsten silicide.

The term "aluminum-bearing surfaces", as used herein, is meant to include surfaces in the chamber which contain aluminum or aluminum compounds. Included in the definition, therefore, are any aluminum metal surfaces in the chamber, as well as aluminum nitride surfaces, oxidized aluminum surfaces, and aluminum fluoride ($AlF_x$) surfaces resulting from reaction between the fluorine residues and the other aluminum-bearing materials. Included, therefore, are the aluminum nitride surfaces formed on graphite susceptors and other processing equipment such as described in Telford et al. Ser. No. 07/968,710, the disclosure of which is hereby incorporated by reference into this application; as well as aluminum nitride processing equipment such as described in copending Japanese patent application Ser. No. 5-126100, the disclosure of which is hereby incorporated by reference.

While it is not our intent to be bound by any theories of operation, it is believed that a tungsten silicide preconditioning deposit, formed on the surfaces of the deposition chamber, in a single step process using a chlorine-substituted silane such as dichlorosilane (DCS), having the formula $SiH_2Cl_2$, provides a coating which, while effective to precondition the chamber for the subsequent formation of tungsten silicide depositions on substrates, also contains more stress than a tungsten silicide coating formed using nonchlorine-substituted silanes, such as, for example, silane ($SiH_4$) as the gaseous source of silicon. Thus, during the course of subsequent depositions on substrates, and the resultant buildup of residues on the chamber surfaces, the stressed interface between the DCS-based tungsten silicide and the aluminum-bearing surface fractures (due to the stress) and the residues then flake off, resulting in the undesirable formation of particles in the chamber which, in turn, contaminate any substrates being processed therein.

In contrast, the preconditioning or retreating process of the invention provides an intermediary deposit of silane-based tungsten silicide between the aluminum-bearing surfaces and subsequent DCS-based tungsten silicide deposits, so that transmission of the stresses, in the DCS-based tungsten silicide, to the interface between the tungsten silicide and the aluminum bearing surfaces, is inhibited by the intermediate stress-relieving or absorbing silane-based tungsten silicide material. That is, the silane-based tungsten silicide deposit formed between the aluminum-bearing surface and the subsequently deposited DCS-based tungsten silicide, acts as a cushion to inhibit the transfer of stress from the DCS-based material through the silane-based tungsten silicide to the interface with the aluminum-bearing surfaces.

Formation of the Silane-based First Tungsten Silicide Deposit

The silane-based first tungsten silicide material to be deposited on the susceptor may be applied in any way that provides a silane-based tungsten silicide coating on the aluminum-bearing surfaces. For example, the tungsten silicide deposit may be applied or deposited on the susceptor surface by a CVD process wherein, for example, a mixture of a tungsten-bearing gas, silane gas, and a carrier gas, is flowed into the chamber. The silane-based tungsten silicide material may also be applied to the susceptor surface by a plasma enhanced chemical vapor deposition (PECVD) process.

When chemical vapor deposition is used, a gaseous mixture, for example, of a tungsten-bearing gas, such as $WF_6$ gas; silane gas ($SiH_4$); and a carrier gas, such as argon or helium, may be flowed into the vacuum chamber at flow rates which may comprise from about 1 to about 10 standard cubic centimeters per minute (sccm) for $WF_6$, preferably from about 1 to about 5 sccm, with a typical rate being about 2 sccm; and a flow rate of silane of from about 10 to about 100 sccm, with a preferred rate being in the range of from about 25 to about 75 sccm, with a typical rate being about 50 sccm. The carrier gas in the mixture, preferably argon or helium, is flowed into the chamber at a rate of from about 200 to about 1000 sccm, preferably at a rate in the range of from about 300 to about 700 sccm, with a typical rate being about 500 sccm. It should be noted that while the use of silane as the non-chlorinated gaseous source of silicon is preferred during this step, the use of other nonchlorinated gaseous sources of silicon, such as, for example, disilane (Si$_2$H$_6$), should be deemed to be within the scope of the invention. Therefore, it will be understood that the use of the term "silane-based tungsten silicide" is not intended to limit the first step of the process to only the use of silane gas.

During the silane-based tungsten silicide deposition, the susceptor, i.e., the substrate support plate, should be maintained in a temperature range of from about 300° C. to about 700° C., preferably front about 425° C. to about 600° C., with a typical temperature being about 475° C.

With respect to pressure during the silane-based tungsten silicide deposition process, the vacuum chamber should be maintained at a pressure in the range of from about 0.1 Torr (100 milliTorr) to about 2 Torr, with a preferred range being from about 250 milliTorr to about 1250 milliTorr, with a typical pressure being about 500 milliTorr. Pressures lower than about 100 milliTorr could be used, but are deemed to be wasteful of process gas, while the use of pressures higher than about 2 Torr may give rise to gas phase reactions.

The thickness of the silane-based tungsten silicide layer deposited on the aluminum-bearing surfaces in the deposition chamber should be in an amount sufficient to provide the desired intermediate stress-relieving properties in the deposited silane-based tungsten silicide layer. It has been found that to achieve this, the thickness of the silane-based tungsten silicide material initially deposited on the aluminum-bearing surface should range from about 200 Angstroms to about 1500 Angstroms, with a preferably thickness being in the range of from about 800 Angstroms to about 1200 Angstroms, typically about 1000 Angstroms. It should be noted that when only the first tungsten silicide pretreatment deposit is formed over the aluminum-bearing surfaces, prior to the first deposition on a substrate, the thickness of the silane-based tungsten silicide should be at least about 200 Angstroms, up to about 1500 Angstroms, with at least about 800 Angstroms thickness preferred. In either case, silane-based tungsten silicide layers thinner than about 200 Angstroms are not deemed to be sufficiently thick to provide the desired stress relief or absorption, while silane-based tungsten silicide layers thicker than about 1500 Angstroms are not needed, and therefore while useful, are not deemed to be economical.

While the use of a CVD process to form the silane-based tungsten silicide layer is preferred, the silane-based tungsten silicide may also be applied to the aluminum-bearing surfaces using a plasma assisted deposition, wherein, for example, the power utilized for the plasma may be in the range of from about 25 to about 75 watts, with a typical amount of power being about 50 watts.

A vacuum deposition chamber suitable for use in accordance with the present invention may comprise any commercially available chemical vapor deposition equipment capable of being operated in accordance with the invention. Such chamber should include a susceptor on which the substrate will rest in the chamber or reactor during subsequent processing of the substrate. An example of equipment which may be used in the practice of the invention comprises the Precision 5000 multi-chamber deposition and etching system available from Applied Materials, Inc., Santa Clara, Calif. A suitable multi-chambered apparatus is described in U.S. Pat. No. 4,785,962, the disclosure of which is hereby incorporated by reference.

Formation of the ChloroSilane-based Second Tungsten Silicide Deposit

After formation of the silane-based first tungsten silicide material on the aluminum-bearing surfaces in the deposition chamber, to provide the stress-relieving or absorbing deposit, in a preferred embodiment, a second tungsten silicide deposit is then formed over the first tungsten silicide deposit. The second tungsten silicide deposit comprises a chlorosilane-based tungsten silicide deposit, which is formed over the silane-based tungsten silicide material to provide the desired preconditioning of the chamber so that the first substrate subsequently processed therein to form a chlorosilane-based tungsten silicide layer on the substrate, e.g., a DCS-based tungsten silicide layer on the substrate, will have a satisfactory coating deposited thereon. By use of the term "chlorosilane" herein is meant a chlorine-substituted silane such as dichlorosilane (SiH$_2$Cl$_2$), monochlorosilane (SiH$_3$Cl), and trichlorosilane (SiHCl$_3$).

The chlorosilane-based tungsten silicide deposit to be formed over the silane-based tungsten silicide material, already deposited on the aluminum-bearing surfaces in the chamber, may be applied in any way that provides a second tungsten silicide coating over the previously formed tungsten silicide material. For example, the chlorosilane-based tungsten silicide deposit may be applied or deposited on the previously coated aluminum-bearing surfaces in the chamber by a CVD process wherein, for example, a mixture of WF$_6$ and SiH$_2$Cl$_2$ gases and a carrier gas such as argon or helium is flowed into the chamber. The chlorosilane-bearing tungsten silicide deposit may also be applied to the susceptor surface by a plasma enhanced chemical vapor deposition (PECVD) process.

When chemical vapor deposition is used, a gaseous mixture comprising, for example, WF$_6$ gas; a chlorosilane silicon gas source such as, for example, a dichlorosilane (SiH$_2$Cl$_2$), monochlorosilane (SiH$_3$Cl), or trichlorosilane (SiHCl$_3$) silicon source; and a carrier gas, such as argon or helium, may be flowed into the vacuum chamber. It should be noted that disilane (Si$_2$H$_6$) and/or silane (SiH$_4$) may be used with the chlorosilane as a supplemental source of silicon and/or as a reaction initiator in this step. The flow rates may comprise a rate of about 2 to 10 standard cubic centimeters per minute (sccm) for WF$_6$, preferably from about 3 to about 6 sccm, with a typical rate being about 4 sccm; and a flow rate of chlorosilane-based or disilane silicon-containing gas such as dichlorosilane (SiH$_2$Cl$_2$) of from about 50 to about 400 sccm, with a preferred rate being in the range of from about 100 to about 300 sccm, with a typical rate being about 150 sccm. The optional supplemental flow of disilane and/or silane into the chamber may be at a rate of from 0 sccm to about 500 sccm, preferably from 0 to about 200 sccm. The carrier gas in the mixture, preferably argon or helium, is flowed into the chamber at a rate of from about 200 to about 1000 sccm, preferably at a rate in the range of from about 300 to about 700 sccm, with a typical rate being about 500 sccm.

During this second tungsten silicide deposition, the susceptor, i.e., the substrate support plate, should be maintained in a temperature range of from about 500° C. to about 700° C., preferably from about 525° C. to about 650° C., with a typical temperature being about 550° C. It should be noted, however, that due to the coolants circulated, respectively, adjacent the deposition chamber walls and lid, these surfaces will be considerably cooler during the deposition, e.g., a wall temperatures of about 45° C. and a lid temperature of about 10° C.

With respect to pressure during the second deposition process, the vacuum chamber should be maintained at a pressure in the range of from about 0.5 Torr to about 10 Torr, with a preferred range being from about 1 Torr to about 5 Torr, with a typical pressure being about 2 Torr.

The thickness of the chlorosilane-based tungsten silicide material deposited on the susceptor should be in an amount sufficient to enable acceptable subsequent deposition of a tungsten silicide layer on the first substrate subsequently processed after the cleaning and two step deposition or pretreatment of the invention. It has been found that to achieve this, the thickness of the chlorosilane-based tungsten silicide material deposited on the silane-based tungsten silicide-coated aluminum-bearing surfaces in the chamber should range from about 800 Angstroms to about 3000 Angstroms, with a preferably thickness being in the range of from about 1000 Angstroms to about 2000 Angstroms.

When the chlorosilane-based upper tungsten silicide deposit is formed using a plasma assisted deposition, the power utilized for the plasma may be in the range of from about 25 to about 75 watts, with a typical amount of power being about 50 watts. Further, when plasma assisted CVD is used, the above described gas mixture of $WF_6$, dichlorosilane, and carrier gas is preferably flowed into the chamber at a rate of from about 0.5 to about 8.5 sccm for $WF_6$, with a typical rate being about 4.5 sccm; and from about 50 to about 250 sccm for the chloro-based silane gas such as $SiH_2Cl_2$ (dichlorosilane), with a typical rate being about 100 sccm. A carrier gas, such as argon, is not used with the plasma to avoid sputtering the walls of the chamber.

The following examples will serve to further illustrate the invention.

EXAMPLE I

To illustrate the prior art practice of depositing tungsten silicide on a wafer directly after cleaning of the chamber, a reaction chamber utilizing equipment therein, having aluminum-bearing surfaces therein, including a susceptor with an aluminum nitride surface, was used to deposit a series of tungsten silicide layers on integrated circuit structures on semiconductor wafers.

After processing about 25 wafers at a temperature of 550° C., the chamber surfaces were cleaned using a $NF_3$ plasma to remove buildup of tungsten silicide from the inside surfaces of the reactor. After cleaning, a wafer was mounted on a susceptor having an aluminum nitride surface, and (without precoating the susceptor or other aluminum-bearing surfaces of the chamber) a tungsten silicide layer was deposited on the wafer using a gas mixture comprising $WF_6$, which was flowed into the chamber at 4 sccm; dichlorosilane ($SiH_2Cl_2$), which was flowed into the chamber at 150 sccm; and argon as a carrier gas, which was flowed into the chamber at 500 sccm. The susceptor was maintained at a temperature of about 550° C., and the chamber had a pressure of about 3 Torr during the deposition.

The coated wafer was removed from the chamber and examined. The tungsten silicide was found to be inferior because the resistivity of the coating was about 700 μΩ cm, i.e., about 100 μΩ cm below the desired resistivity (more tungsten-rich). Such low resistivity coatings of tungsten silicide have been found to delaminate in post processing. The tungsten silicide coating was also found to be less uniform or homogeneous in resistivity value across the wafer; i.e., the resistivity was found to vary by as much as 5% across the wafer, when a resistivity variation of not more than 3% is desirable.

EXAMPLE II

The procedure explained above in Example I was again repeated except that after the chamber was cleaned, as described above, and prior to placing a wafer on the susceptor, tungsten silicide material was deposited on the aluminum-bearing surfaces in the chamber under the same conditions as described above with respect to deposition on the wafer, i.e., using $WF_6$, $SiH_2Cl_2$ (DCS), and a carrier gas. Thereafter, a first wafer was placed on the coated susceptor support plate, and a DCS-based tungsten silicide layer was deposited on the wafer under the same conditions as for the deposition on the wafer in Example I after the cleaning step. The coated wafer was removed and examined and found to have a uniform layer of tungsten silicide deposited thereon of about 2500 Angstroms thickness. The resistivity of the resultant tungsten silicide layer on the wafer was found to be about 800 μΩ cm, with less than a 3% variation in resistivity in the coating across the wafer.

A second wafer was then mounted on the tungsten silicide coated susceptor, and tungsten silicide was deposited under the same conditions as noted with respect to the last wafer. This second wafer was then also removed and examined, and the tungsten silicide coating was found to have the same quality coating as on the previous wafer, i.e., a resistivity of about 800 μΩ cm, and less than a 3% variation in resistivity in the coating across the wafer.

However, after about 10 wafers were processed in the chamber, it was noted that some particle formation had occurred, which was believed to be due to fracture of the stressed DCS-based tungsten silicide deposits or residues on the chamber surfaces from underlying aluminum-bearing surfaces, and/or aluminum fluoride ($AlF_x$) surfaces formed on the aluminum-bearing surfaces, of the chamber from fluorine residues left in the chamber from the cleaning step.

EXAMPLE III

The procedure explained above in Example I was again repeated except that, in accordance with the invention, after the chamber was cleaned, as described above, and prior to placing a wafer on the susceptor, a 1000 Angstrom thick deposit of silane-based tungsten silicide was formed on the aluminum-bearing surfaces in the chamber, including the surface of the susceptor, by flowing into the chamber a gas mixture comprising $WF_6$, which was flowed into the chamber at about 2 sccm; silane ($SiH_4$), which was flowed into the chamber at about 50 sccm; and argon as a carrier gas, which was flowed into the chamber at about 500 sccm. The susceptor temperature was maintained at about 475° C., and the chamber was maintained at a pressure of about 500 milliTorr during the deposition.

After depositing the 1000 Angstrom thick silane-based tungsten silicide material on the aluminum-bearing surfaces in the chambers, DCS-based tungsten silicide material was deposited over the silane-based first tungsten silicide deposit. The dichlorosilane-based tungsten silicide material was deposited by flowing into the chamber 4 sccm of $WF_6$; 150 sccm of dichlorosilane; and 500 sccm of argon as a carrier gas. The susceptor was maintained at a temperature of about 550° C., and the chamber had a pressure of about 3 Torr during the dichlorosilane-based tungsten silicide deposition.

Thereafter, a first wafer was placed on the coated susceptor support plate, and a tungsten silicide layer was deposited on the wafer under the same conditions as for the deposition on the wafer in Example I after the cleaning step. The coated wafer was removed and examined and found to have a uniform layer of tungsten silicide deposited thereon of about 500 Angstrom thickness. The resistivity of the resultant tungsten silicide layer on the wafer was found to be about 800 μΩ cm, with less than a 3% variation in resistivity in the coating across the wafer. A second wafer was similarly processed and tested, and found to yield similar results.

Further tungsten silicide depositions of DCS-based tungsten silicide were carried out on 25 more wafers, while the chamber was monitored for the presence of particles, indicative of flaking off of tungsten silicide residues deposited on the aluminum-bearing surfaces of the chamber during the depositions. No particles were observed in the chamber during the processing of the 25 wafers.

Similar results were obtained by modifying the process to include the use of plasma enhanced chemical vapor deposition of the dichlorosilane-based tungsten silicide. The conditions were the same as for the chemical vapor deposition except that the power was maintained at 25 watts, $WF_6$ was flowed at 4.5 sccm, and dichlorosilane was flowed in at a rate of 150 sccm, and no carrier gas was used to avoid sputtering the reactor chamber walls. Similar results may also be obtained if the silane-based tungsten silicide coating is deposited by a plasma-assisted CVD process.

Satisfactory results may also be obtained if only the first silane-based tungsten silicide deposit is formed on the cleaned aluminum-bearing surfaces prior to the DCS-based tungsten silicide deposit on the first wafer thereafter processed. In such an instance, however, it may be advisable to use a "dummy" wafer for the first deposit of chlorosilane-based tungsten silicide on a wafer, to avoid risking the formation of an inferior coating of tungsten silicide on the first wafer after the chamber cleaning operation.

Thus, it will be seen that the described treatment, in accordance with the invention, of the aluminum-bearing surfaces of the deposition chamber, including surfaces such as a susceptor with an aluminum nitride surface thereon, enables the production of integrated circuit structures on semiconductor wafers, and in particular the deposition of a layer of tungsten silicide thereon, on a reproducible basis, regardless of periodic cleaning of the chamber, while also inhibiting the formation of particles in the chamber.

Having thus described the invention what is claimed is:

1. A process for pretreating a vacuum deposition chamber having internal aluminum-bearing surfaces after a prior cleaning step which comprises the steps of:
    a) forming a first tungsten silicide deposit on said aluminum-bearing surfaces in the chamber by flowing into the chamber gases comprising a gaseous source of tungsten and a silane gas; and
    b) then forming a second tungsten silicide deposit over said first tungsten silicide deposit by flowing into said chamber gases comprising a gaseous source of tungsten and a chlorosilane gas.

2. The process of claim 1 wherein said first deposit of tungsten silicide is carried out until a thickness of at least about 200 Angstroms has been formed over said aluminum-bearing surfaces.

3. The process of claim 1 wherein said first deposit of tungsten silicide is carried out until a thickness of at least about 800 Angstroms has been formed over said aluminum-bearing surfaces.

4. The process of claim 1 wherein said gaseous source of tungsten comprises $WF_6$.

5. The process of claim 1 wherein said second deposit of tungsten silicide is carried out until a thickness of at least about 800 Angstroms has been formed over said aluminum-bearing surfaces.

6. The process of claim 1 wherein said first deposit of tungsten silicide is carried out until a thickness of at least about 1000 Angstroms has been formed over said aluminum-bearing surfaces.

7. The process of claim 1 wherein said chlorosilane gas comprises dichlorosilane having the formula $SiH_2Cl_2$.

8. The process of claim 1 wherein said step of forming said first tungsten silicide deposit further comprises flowing a carrier gas into said chamber with said gaseous source of tungsten and said silane gas.

9. The process of claim 1 wherein said step of forming said first tungsten silicide deposit further comprises maintaining a plasma in said chamber while flowing said gaseous source of tungsten and said silane gas into said chamber.

10. The process of claim 1 wherein said step of forming said second tungsten silicide deposit further comprises flowing a carrier gas into said chamber with said gaseous source of tungsten and said chlorosilane gas.

11. The process of claim 1 wherein said step of forming said second tungsten silicide deposit further comprises maintaining a plasma in said chamber while flowing said gaseous source of tungsten and said chlorosilane gas into said chamber.

12. The process of claim 1 wherein said step of forming said second tungsten silicide deposit over said first tungsten silicide deposit further comprises flowing into said chamber a chlorosilane gas selected from the group consisting of dichlorosilane ($SiH_2Cl_2$), monochlorosilane ($SiH_3Cl$), and trichlorosilane ($SiHCl_3$).

13. A process for pretreating a vacuum deposition chamber having internal aluminum-bearing surfaces, and a susceptor therein, after a prior cleaning step which comprises the steps of:
    a) forming a first CVD tungsten silicide deposit, having a thickness of at least about 200 Angstroms, on said aluminum-bearing surfaces in the chamber by flowing into the chamber gases comprising $WF_6$ gas, silane gas, and a carrier gas; and
    b) then forming a second CVD tungsten silicide deposit, having a thickness of at least about 800 Angstroms, over said first tungsten silicide deposit by flowing into said chamber gases comprising $WF_6$ gas, a carrier gas, and a chlorosilane gas selected from the group consisting of dichlorosilane ($SiH_2Cl_2$), monochlorosilane ($SiH_3Cl$), and trichlorosilane ($SiHCl_3$).

14. The process of claim 13 wherein said step of forming said first tungsten silicide deposit further comprises maintaining a susceptor temperature of at least about 300° C. during said first deposition step.

15. The process of claim 13 wherein said step of forming said first tungsten silicide deposit further comprises maintaining said chamber at a pressure of from about 0.1 Torr to about 2 Torr during said first deposition step.

16. The process of claim 13 wherein said step of forming said first tungsten silicide deposit further comprises flowing into said chamber:
    a) from about 1 to about 10 standard cubic centimeters per minute (sccm) of said $WF_6$ gas;
    b) from about 10 to about 100 sccm of said silane gas; and
    c) from about 200 to about 1000 sccm of said carrier gas.

17. The process of claim 13 wherein said step of forming said second tungsten silicide deposit over said first tungsten silicide deposit further comprises: maintaining a susceptor temperature of at least about 500° C. during said second deposition step.

18. The process of claim 13 wherein said step of forming said second tungsten silicide deposit further comprises maintaining said chamber at a pressure of from about 0.5

Torr to about 10 Torr during said second deposition step.

19. The process of claim 13 wherein said step of forming said second tungsten silicide deposit further comprises flowing into said chamber:
- a) from about 2 to about 10 standard cubic centimeters per minute (sccm) of said $WF_6$ gas;
- b) from about 50 to about 400 sccm of said chlorosilane gas; and
- c) from about 200 to about 1000 sccm of said carrier gas.

20. A process for depositing tungsten silicide on substrates in a vacuum deposition chamber after a prior cleaning step and wherein the chamber has internal aluminum-bearing surfaces, comprising the steps of:
- a) forming a first tungsten silicide deposit on said internal aluminum-bearing chamber surfaces in the absence of said substrates by flowing into the chamber gases comprising a gaseous source of tungsten and silane gas;
- b) then forming a second tungsten silicide deposit over said first tungsten silicide deposit by flowing into said chamber gases comprising a gaseous source of tungsten and a chlorosilane gas; and
- c) then forming a tungsten silicide deposit on said substrates by flowing into said chamber gases comprising a gaseous source of tungsten and a chlorosilane gas.

21. The process of claim 20, in which said second tungsten silicide deposit over said first tungsten silicide deposit is formed in the absence of said substrate.

22. A process for depositing tungsten silicide on substrates within a vacuum deposition chamber having internal aluminum-bearing surfaces after a prior cleaning step, comprising the step of:
- a) forming a first tungsten silicide deposit on the aluminum-bearing surfaces in the chamber by flowing into the chamber gases comprising a gaseous source of tungsten and silane gas; and
- b) then flowing into said chamber gases comprising a gaseous source of tungsten and a chlorosilane gas to form a second tungsten silicide deposit over said first tungsten silicide deposit, and the tungsten silicide deposit on said substrates.

23. A process for depositing tungsten silicide upon a substrate contained in a vacuum chamber, comprising the steps of:
- a) cleaning the chamber by flowing a cleaning gas into said chamber to clean deposits of tungsten silicide from the chamber walls and other internal chamber surfaces;
- b) pretreating said vacuum chamber by:
  - i) forming a first tungsten silicide deposit on aluminum-bearing surfaces within the chamber by flowing into the chamber gases comprising a gaseous source of tungsten and silane gas, and
  - ii) then forming a second tungsten silicide deposit over said first tungsten silicide deposit by flowing into said chamber gases comprising a gaseous source of tungsten and a chlorosilane gas; and
- c) then loading one or more substrates into said chamber; and
- d) flowing into said chamber gases comprising a gaseous source of tungsten and a chlorosilane gas to deposit the tungsten silicide on said substrates.

24. The process of claim 23, in which a fluorine-bearing gas is utilized to clean the chamber.

25. The process of claim 23, in which a plasma is maintained within said chamber during any or all of said cleaning, pretreating, and flowing steps.

* * * * *